US00RE42739E

(19) United States
(12) Reissued Patent
Fortier

(10) Patent Number: US RE42,739 E
(45) Date of Reissued Patent: Sep. 27, 2011

(54) IMAGER OUTPUT SIGNAL PROCESSING

(75) Inventor: Justin Fortier, Ottawa (CA)

(73) Assignee: Harusaki Technologies, LLC, Wilmington, DE (US)

(21) Appl. No.: 12/717,188

(22) PCT Filed: Dec. 13, 2001

(86) PCT No.: PCT/CA01/01773

§ 371 (c)(1),
(2), (4) Date: Nov. 19, 2003

(87) PCT Pub. No.: WO02/51128

PCT Pub. Date: Jun. 27, 2002

Related U.S. Patent Documents

Reissue of:
(64) Patent No.: 7,339,621
Issued: Mar. 4, 2008
Appl. No.: 10/451,026
Filed: Nov. 19, 2003

U.S. Applications:
(60) Provisional application No. 60/256,336, filed on Dec. 19, 2000.

(51) Int. Cl.
*H04N 3/14* (2006.01)
*H04N 5/335* (2011.01)

(52) U.S. Cl. ..... 348/308; 348/294

(58) Field of Classification Search ..... None
See application file for complete search history.

(56) References Cited

U.S. PATENT DOCUMENTS

| | | | | |
|---|---|---|---|---|
| 5,134,487 | A * | 7/1992 | Taguchi et al. | 348/384.1 |
| 5,248,971 | A * | 9/1993 | Mandl | 341/141 |
| 5,264,940 | A * | 11/1993 | Komiya et al. | 348/298 |
| 5,461,425 | A * | 10/1995 | Fowler et al. | 348/294 |
| 5,886,659 | A * | 3/1999 | Pain et al. | 341/155 |
| 5,955,899 | A * | 9/1999 | Afghahi | 327/65 |
| 6,104,844 | A * | 8/2000 | Alger-Meunier | 382/312 |
| 6,353,324 | B1 * | 3/2002 | Uber et al. | 324/457 |

(Continued)

FOREIGN PATENT DOCUMENTS

EP 0 912 043 A 4/1999

*Primary Examiner* — Justin P Misleh
(74) *Attorney, Agent, or Firm* — McAndrews, Held & Malloy Ltd.

(57) ABSTRACT

The method and apparatus for processing pixel output signals from column lines in an imager having an array of pixels in rows and columns uses a sigma-delta type analog-to-digital converter to convert the output signals on each column line to digital signals and feeding them to a digital signal processor. The converter is monitored to stop sampling of a pixel with the detection of pixel saturation, which is carried out by counting a predetermined number of consecutive zeros in the converted signal. In addition, the next pixel in a column may be controlled to be read with the saturation of the previous pixel, and the next row of pixels may be controlled to be read with the saturation of the pixels in the previous row. Further, sets of a predetermined number of converter output samples are condensed by a decimator into binary numbers of predetermined bit length. The outputs of the decimators may be fed directly to the digital signal processor or they may be multiplexed to provide one or more inputs to the digital signal processor.

44 Claims, 9 Drawing Sheets

U.S. PATENT DOCUMENTS 6,473,122 B1 * 10/2002 Kanekal ..... 348/340
6,606,120 B1 * 8/2003 Merrill et al. ..... 348/273
6,665,013 B1 * 12/2003 Fossum et al. ..... 348/308
6,678,039 B2 * 1/2004 Charbon ..... 356/5.01
6,765,619 B1 * 7/2004 Deng et al. ..... 348/362
6,831,684 B1 * 12/2004 Ewedemi et al. ..... 348/222.1
7,339,621 B2 * 3/2008 Fortier ..... 348/308

* cited by examiner

IMAGER OUTPUT SIGNAL PROCESSING

Matter enclosed in heavy brackets [ ] appears in the original patent but forms no part of this reissue specification; matter printed in italics indicates the additions made by reissue.

*This application is a 371 application of PCT application PCT/CA01/01773 filed Dec. 13, 2001, which claims the benefit of U.S. provisional application 60/256,336 filed Dec. 19, 2000.* This application was published in English on Jun. 27, 2002 as International Publication Number WO 02/51128 A2.

FIELD OF THE INVENTION

The invention relates generally to CMOS imagers, and more particularly to the processing of column level signals in an imager.

BACKGROUND OF THE INVENTION

Currently, CMOS imagers are well known in the art and are implemented in many different applications. One of the primary areas that CMOS imagers can be found is in portable applications such as digital cameras that use battery power. It is therefore very desirable to have a CMOS imager that is powered with a low supply voltage, for example one volt (1V).

Having a voltage this low, however, leads to a number of problems. For one, the quantization values of an imager become very small. For example, a typical CMOS imager might use 8 bits of resolution and have a supply voltage of 3.3 volts. This leads to a quantization level of 3.3V/256=12.9 mV. If an imager is implemented with a one volt supply and 8 bits of resolution then the quantization level is 1V/256=3.9 mV. The proportion of noise relative to this low quantization value becomes very large and has a greater impact on the output.

Another problem involves the pixel structure that is used in most CMOS imagers, namely using 3 n-type MOS transistors with a photodiode. The pixel consists of a precharge transistor, a source follower amplifying transistor and an access transistor. When the pixel is precharged to the supply voltage, one threshold voltage, $V_t$, is lost through the precharge transistor. Once the pixel is exposed to light and the output is being read out to the column, another $V_t$ is lost through the source follower amplifying transistor. A typical $V_t$ for MOS transistors is 0.07 V, leaving a maximum voltage output to the column of 0.86V (1V-2*0.07V), further limiting the quantization levels. FIG. 1 illustrates column voltage output from a typical 3-transistor CMOS pixel versus integration time. The maximum voltage that can be red out to the column is $V_{supply}$-2*$V_t$. During the integration time $t_{int}$, if the light on the pixel is sufficiently intense, the photodiode saturates and the voltage on the column is goes to zero.

Quantizing the output from the pixels into digital data for the Digital Signal Processor (DSP) may be carried out in a number of known ways. Correlated Double Sampling (CDS) quantizes the output of the column signal twice, once at the beginning of the integration period and once at the end. From these two samples the DSP calculates the slope of the pixel output to determine the brightness of the pixel. This method is highly susceptible to noise and as a result of the high noise to quantization level ratio can be very inaccurate in a low voltage CMOS imager. Also, by using only two points to calculate the slope of the pixel output there is no accounting for a saturated pixel. Any pixels that saturate at different times in the integration period are all calculated as having the same slope, and thus all those pixels are considered to have the same value.

Successive approximation is another method of converting the analog output from the pixel into a digital signal. In this system the output at the end of the integration period is successively compared to different threshold levels, each representing one bit of resolution of the final output. The thresholds are created through capacitors that must be sized in precise ratios (C, ½C, ¼C, etc.) which is both difficult to implement and also occupies a large amount of space. Also, the capacitors on every column across the array must be matched with one another for consistent results, which is not always attainable due to process impurities. The problem of noise is a large factor in successive approximation, as both the small quantization levels to noise ratio as well as capacitance noise, which is larger in small capacitors, will accumulate to yield inaccurate results. Successive approximation also does not directly account for the problem of threshold voltage loss through the pixel transistors. Finally, successive approximation takes a single sample at the end of the integration period and therefore, has no way of differentiating between pixels that saturate at different times throughout the integration period.

Therefore, there is a need for an efficient method and apparatus that is suited to low voltage imagers for processing the pixel output signals at the column level.

SUMMARY OF THE INVENTION

The invention is directed to a method and apparatus for processing pixel output signals from column lines in an imager having an array of pixels in rows and columns. The output signals on each column line are converted to digital signals using a sigma-delta type analog-to-digital converter and the digital signals are fed to a digital signal processor.

In accordance with another aspect of the invention, the sigma-delta type converter is monitored to stop sampling of a pixel with the detection of pixel saturation. With the sigma-delta type converter providing an output of mainly logical ones for a high input signal level and an output of mainly zeros for a low input signal level, detecting pixel saturation is carried out by counting a predetermined number of consecutive zeros.

In accordance with a further aspect of the invention, the sigma-delta type converter output is sent to the digital signal processor with the detection of the saturation of a pixel.

In accordance with another aspect of the invention, sets of a predetermined number of sigma-delta type converter output samples are condensed by a decimator into binary numbers of predetermined bit length. In addition, the number of sigma-delta type converter output samples in a set wherein the pixel has saturated is determined using a further counter and this number is fed to the decimator. Alternately, the determined number may be fed to the digital signal processor.

In accordance with yet another aspect of this invention, the next pixel in a column is controlled to be read with the saturation of the previous pixel, and the next row of pixels may be controlled to be read with the saturation of the pixels in the previous row.

In accordance with a further aspect of this invention, the outputs of the decimators may be multiplexed to provide one or more inputs to the digital signal processor. A single multiplexer may be used providing one input line to the digital signal processor, or a number of multiplexers may be used providing a number of input lines to the digital signal processor.

Other aspects and advantages of the invention, as well as the structure and operation of various embodiments of the invention, will become apparent to those ordinarily skilled in the art upon review of the following description of the invention in conjunction with the accompanying drawings.

BRIEF DESCRIPTION OF THE DRAWINGS

The invention will be described with reference to the accompanying drawings, wherein.

DETAILED DESCRIPTION OF THE INVENTION

Figure 1:
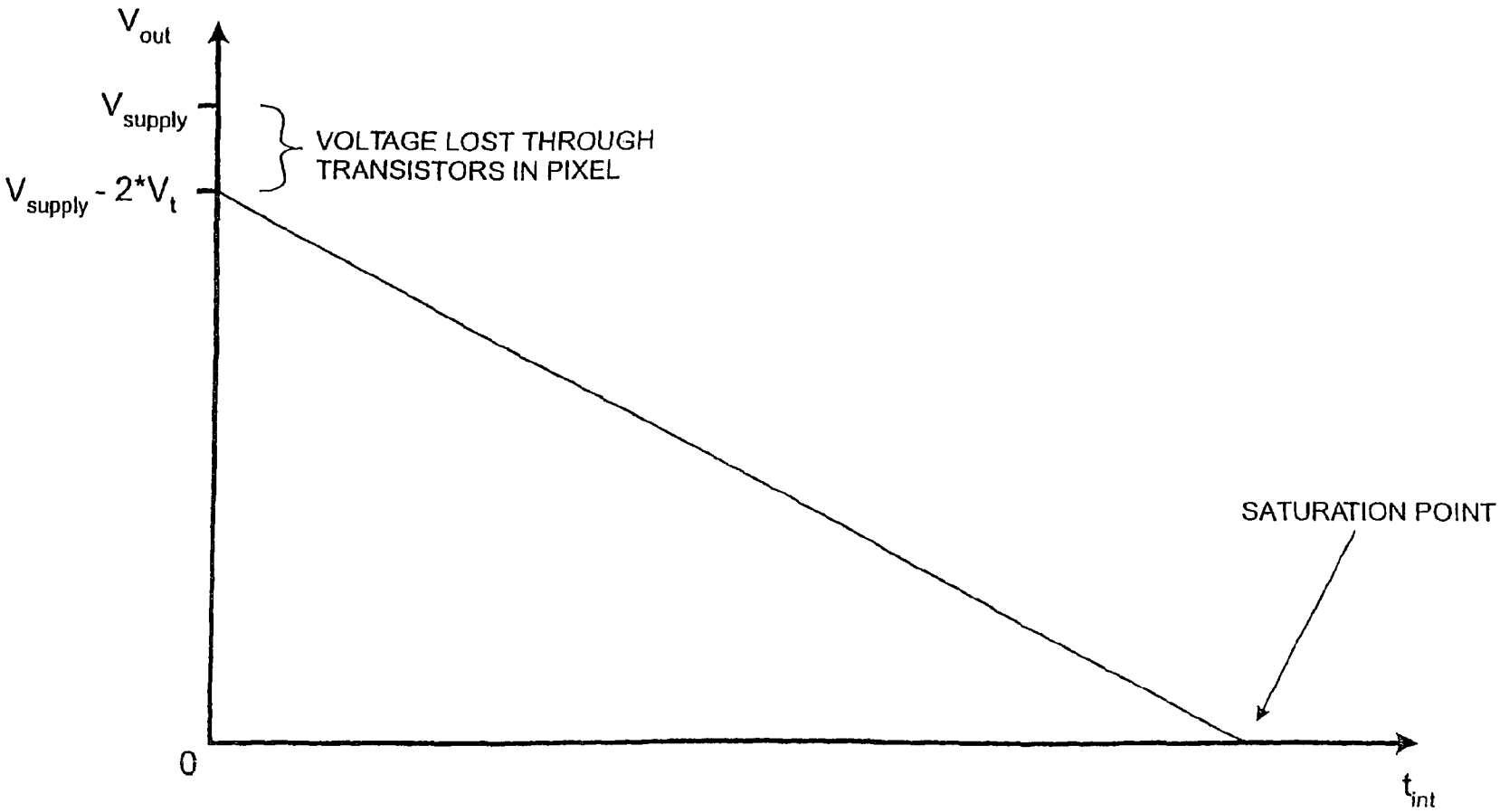
PRIOR ART Figure 1
FIG. 1 illustrates the column voltage output from a pixel versus integration time.
Figure 2:
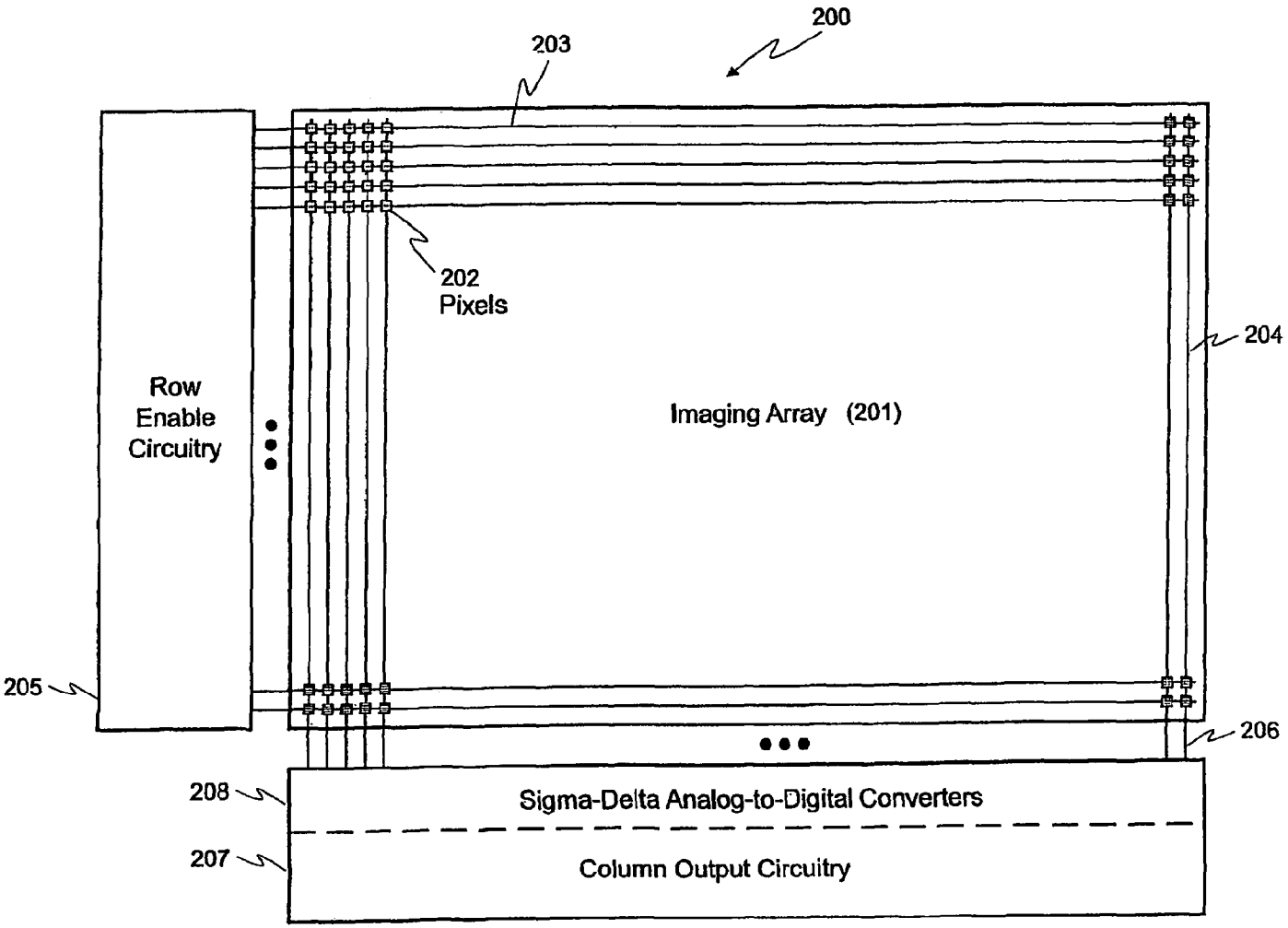
FIG. 2 illustrates the general imaging array architecture.

FIG. 2 schematically illustrates an imager 200 in accordance with the present invention. The imager includes an imaging array 201 of pixels 202 arranged in rows 203 and columns 204. The rows 203 are controlled by row enabling circuitry 205, and the outputs of columns 204 are directed to column output circuitry 207 through lines 206. As illustrated schematically in FIG. 2, the method and apparatus for processing imaging array output signals in accordance with the present invention comprises a column level (one for every column) sigma-delta type analog-to-digital converter 208 in the column output circuitry 207. Sigma-delta converters are well known in the converter art as efficient oversampling analog-to-digital quantizers. This type of converter generally consists of a quantizer that both outputs the digital result as well as feeds the result back to the input. The feedback is subtracted from the input and the difference is integrated and then enters the quantizer. The output of the converter consists of ones and zeros with the average output tracking the average input due to the feedback. In an imaging application the pixel 202 is charged to substantially the supply voltage $V_{supply}$, and with the input to sigma-delta converter 208 being at a high level, the output will be mainly ones with the occasional zero. The pixel 202 will then start to be pulled towards ground at a rate dependent on the intensity of the light, causing the sigma-delta converter 208 to start outputting less ones and more zeros. When the pixel 202 is nearing saturation, a low signal level will be applied to the sigma-delta converter 208 which outputs almost all zeros with only occasional ones.

The column level sigma-delta analog-to-digital converter 208 is able to solve the various problems associated with having a low voltage CMOS imager 200. The sigma-delta converter 208 overcomes the problems of noise through oversampling the output of the pixels 202. More samples yields more accurate results through line-of-best-fit approximations on the output of the converter 208. The line-of-best-fit approximation also allows the sigma-delta converter 208 to indirectly account for the threshold voltage $V_t$ drops across the transistors in the pixel.

In accordance with the present invention the sigma-delta converter 208 is capable of accounting for saturating pixels 202. The integration time $t_{int}$ of the imager 200 corresponds to a set number of outputs from the sigma-delta converter 208 depending on the sampling frequency. If a pixel 202 does not saturate, then the sigma-delta converter 208 will output the set number of samples and the digital signal processor (DSP) will calculate the correct output. In order to account for a pixel 202 that saturates, the output of the sigma-delta converter 208 is monitored and will stop sampling when pixel 202 saturation has been detected. The DSP will then calculate the line-of-best-fit knowing that it has received less values and correspondingly calculates the result.

Figure 3:
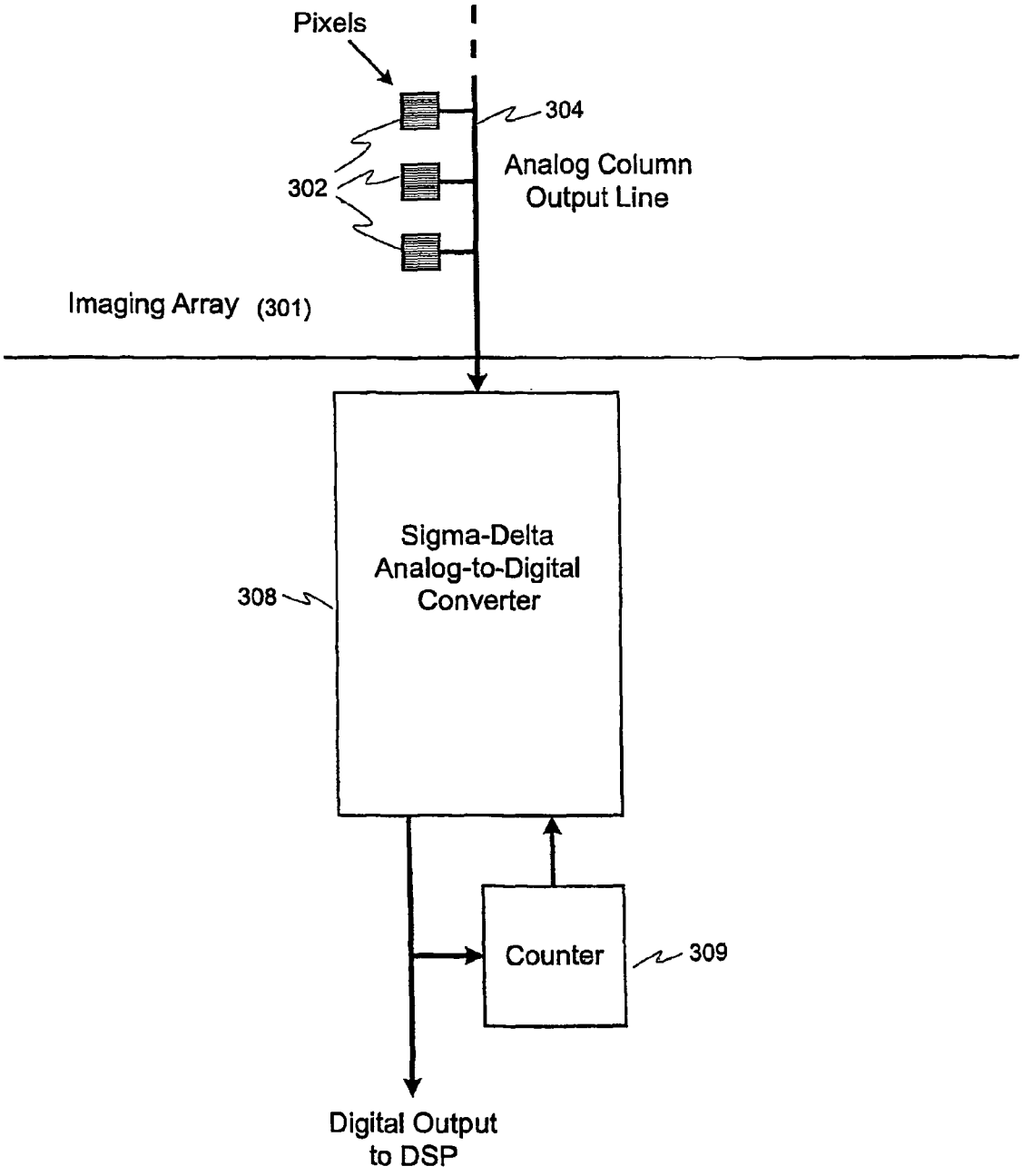
FIG. 3 is a block diagram of the imaging array output for one column.

The invention may be implemented using column level sigma-delta converters 308 having inputs connected to the analog column output lines 304 for pixels 302 with each column level sigma-delta converter 308 having a simple counter 309 associated with it, as shown in FIG. 3. The counter 309 receives the output of the sigma-delta converter 308 and increments every time it receives a zero output and resets every time it receives a logic one output. The counter 308 is set to count to a predetermined number which is representative of the number of consecutive zero outputs from the sigma-delta converter 308 that determines when saturation has occurred. Once this number of consecutive zeros has been realized the sigma-delta converter 308 stops sampling and the output is sent to the DSP minus the string of consecutive zeros. The DSP will then convert this data to a value representative of the brightness of the pixel 302 recognizing the fact that it has less than the usual number of samples. For example, suppose a typical number of samples for the integration period is 1000, while a typical setting for the counter is 10. If a pixel 302 in a column 304 is being read out and after 765 samples the counter has reached 10, (in other words, the last 10 outputs were zeros) then the pixel 302 is considered to have saturated. The sigma-delta converter 308 stops sampling and the first 755 samples are processed by the DSP. The last 10 samples are all zeros and are therefore dropped from the converter output.

There are a number of benefits that are created as a result of implementing this type of column level sigma-delta converter 308. The first and most important of which is that it compensates for the various problems associated with having a low supply voltage $V_{supply}$. The method used to compensate for pixels 302 saturating also leads to additional benefits. With dark pixels 302, the sigma-delta converter 308 will simply read out the pixel 302 with the predetermined number of samples during the integration period resulting in excellent resolution. On the other hand, if the pixel 302 is exposed to bright light, the pixel 302 saturates and the sampling period is less, allowing the DSP to process and output the data faster. Also by accommodating for pixels 302 to saturate, this invention acts as an integrated auto-exposure feature.

Figure 4:
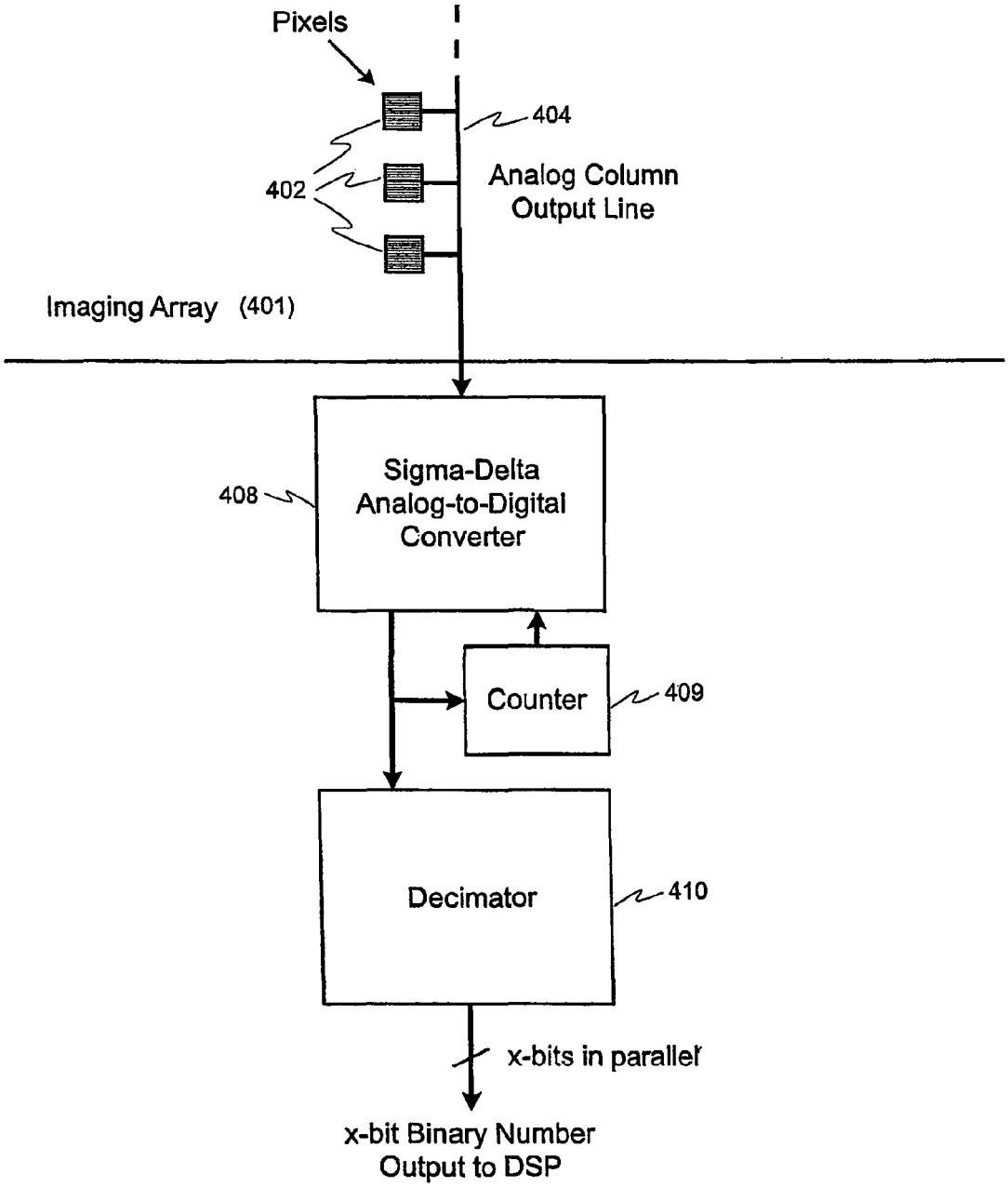
FIG. 4 is a block diagram of a second embodiment of the imaging array output for one column.

Implementing a sigma-delta analog-to-digital converter 208 at the column level in this manner also leads to a number of further embodiments. The first embodiment is illustrated in FIG. 4 which includes the elements described with respect to FIG. 3 with the addition of a decimator 410 at the column level with each sigma-delta converter 408. The decimator 410 will take a number of the samples output by the sigma-delta converter 408 and condense them to a binary number of a predetermined bit length. For example, the decimator 410 might take every 50 samples from the sigma-delta converter 408 and turn them into a 10-bit binary number. The benefit of this system is that it eliminates the problem of bussing all of the samples to the DSP during the integration period. Instead only a certain number of decimated binary numbers will need to be output to the DSP. Another major benefit of having the decimator 410 is that the first level of processing the data is already done at the column level, in parallel, before it even reaches the DSP, resulting in faster processing.

Figure 5:
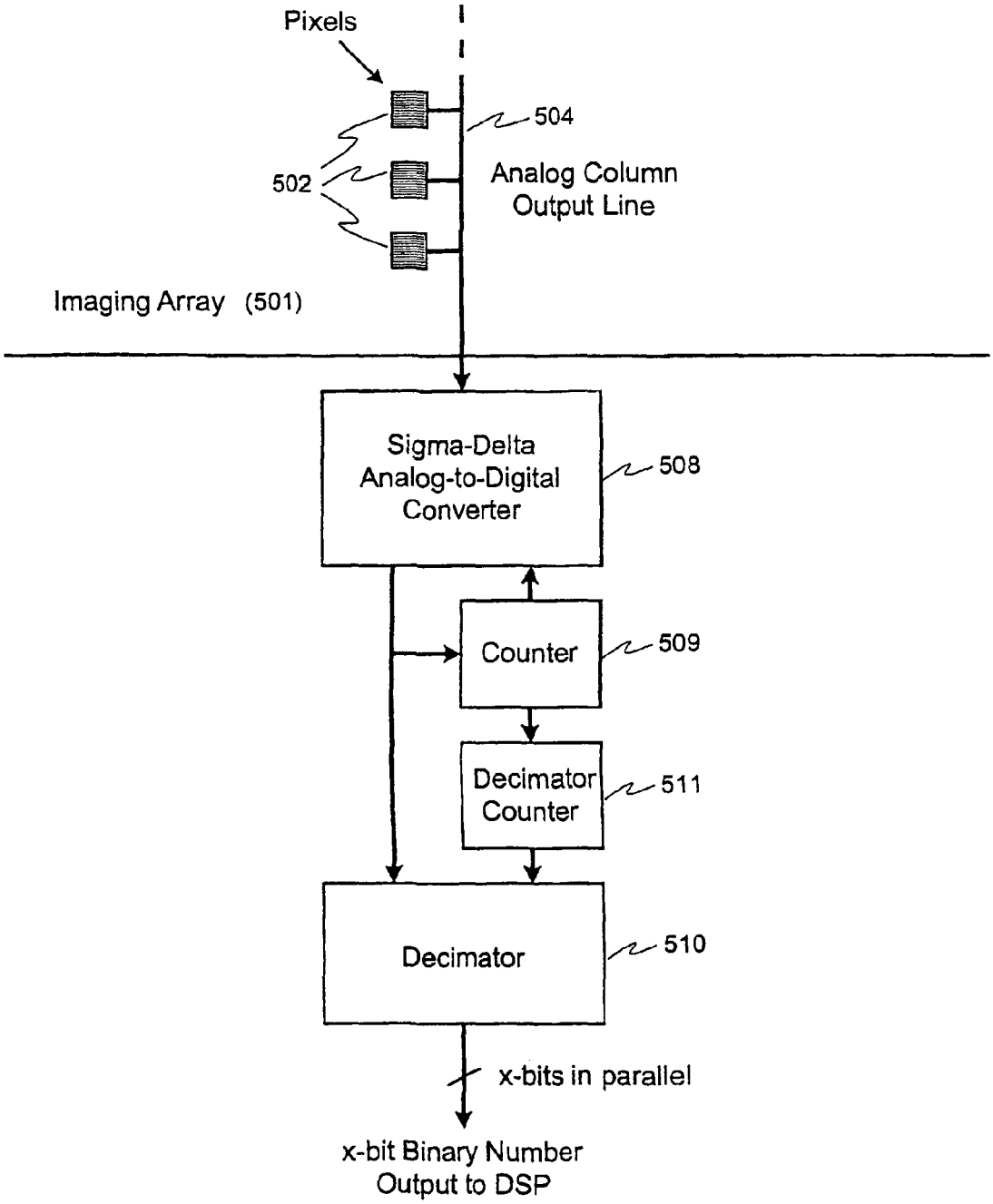
FIG. 5 is a block diagram of a third embodiment of the imaging array output for one column.

In a further embodiment as illustrated in FIG. 5 which in addition to the elements described with respect to FIG. 4, includes a decimator counter 511, that is coupled between the first counter 509 and the decimator 510. The decimator counter 511 simply counts to the number of samples that the decimator 510 inputs before it provides a multi-bit binary number output. Each time the counter 511 reaches that value, the decimator 510 outputs a multi-bit binary number and then the counter 511 resets to zero. When the first counter 509 detects the predetermined number of consecutive zeros, the sigma-delta converter 508 stops sampling and the decimator counter 511 outputs its value to either the decimator 510 or the DSP. If the decimator counter 511 outputs its result directly to the decimator 510, the decimator 510 will calculate the last output taking into account that it does not have the usual number of samples. Therefore the saturation of the pixel 502 is reflected in the output of the decimator 510 and the DSP does not have to compensate for it. On the other hand, if the decimator counter 511 outputs to the DSP, then the DSP will receive the last output from the decimator 510 knowing that it has not accounted for the saturation of the pixel 502 and the DSP will correspondingly calculate the output. The added benefit of this embodiment is a more accurate determination of the pixel's 502 saturation point leading to more accurate resolution in bright pixels.

Figure 6:
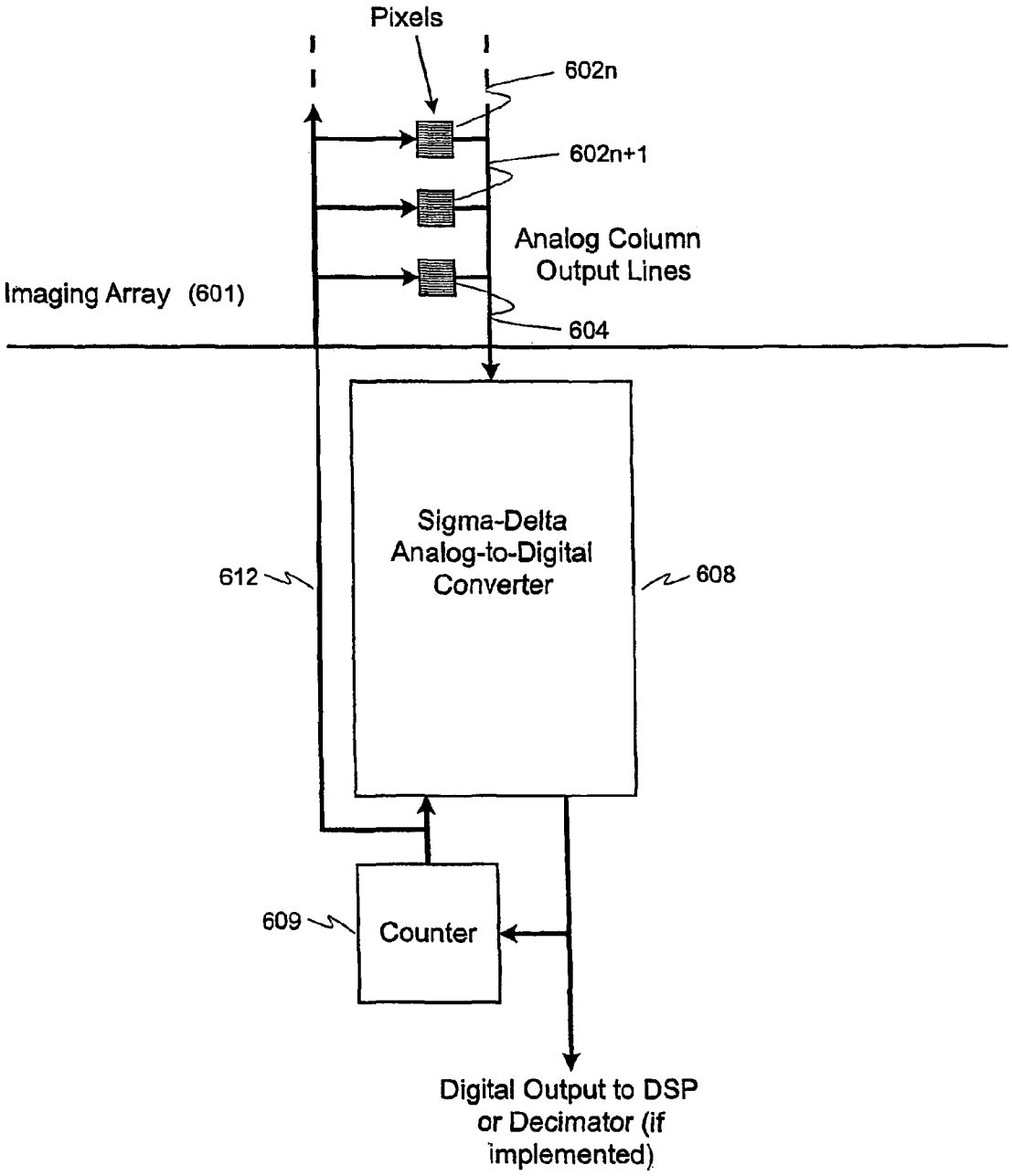
FIG. 6 is a block diagram of the imaging array output for one column with feedback to the pixels.

FIG. 6 illustrates an embodiment that includes a system for permitting columns to be read out faster. The imager includes a sigma-delta analog-to-digital converter 608 connected to analog column output line 604 for converting the output signals from pixels 602. Counter 609 is coupled to the converter 608 to detect saturated pixels 602. Normally, when a pixel 602 saturates the sigma-delta converter 608 stops sampling and waits until the next pixel 602 is selected to be read out. In a system as shown in FIG. 6, once pixel 602 saturation is detected by the counter 609, the sigma-delta converter 608 stops reading the current pixel $\mathbf{602}_n$ and the next pixel $\mathbf{602}_{n+1}$ is automatically selected to be read out immediately. Having the counter 609 feed back to pixels 602 directly through line 611 can allow it to automatically select the next pixel 602 to be read out. This will result in bright columns being read out in a much faster manner.

Figure 7:
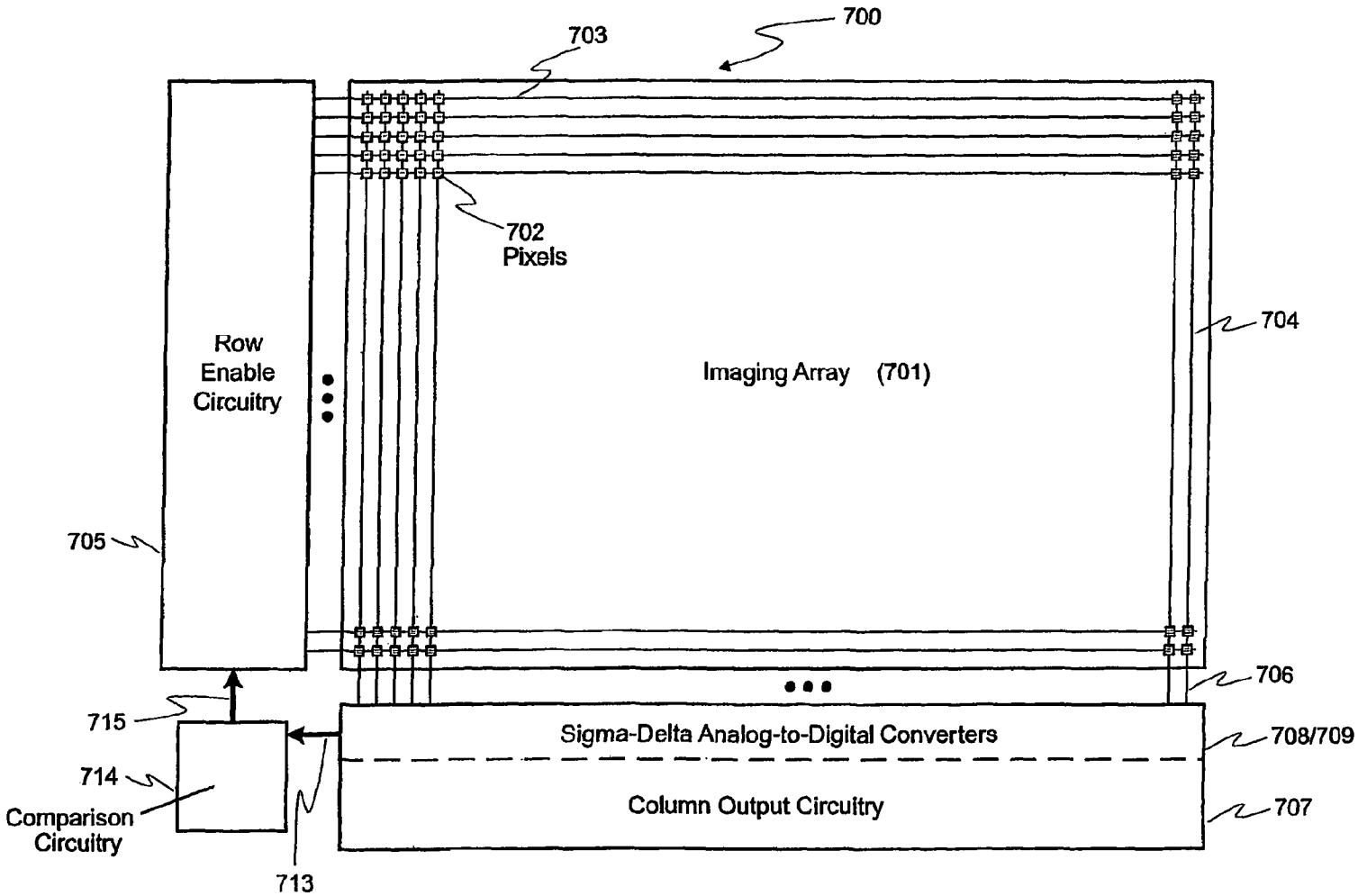
FIG. 7 is an imaging array with counter feedback to row enable circuitry.

FIG. 7 is a schematic of an imager 700 similar to the imager 200 illustrated in FIG. 2, wherein the reading out of rows of saturated pixels 702 may be accelerated. In this particular embodiment, each column converter 708 includes a counter 709 connected to the output of each converter 708. The counter 709 output is fed back to its respective converter 708, as well as to a comparison circuit 714 through line 713. Comparison circuit 714 compares the outputs of all the counters 709 in the columns 704. In the case where all the pixels 702 in a row 703 being read out at one time saturate, the comparison yields a positive result. This result is fed back through line 715 to the row enable circuitry 705 of the imager 700 and automatically selects the next row 703 of pixels 702 to be immediately read out. All of the sigma-delta converters 708 on the column level therefore begin reading out the next row 703 of pixels 702 sooner than in a normal situation where they must wait for the full integration period to pass. When the image is reasonably bright, the entire image can be read out at a faster rate in a uniform fashion. Also, using this method does not affect any of the features related to row selection such as windowing.

Figure 8:
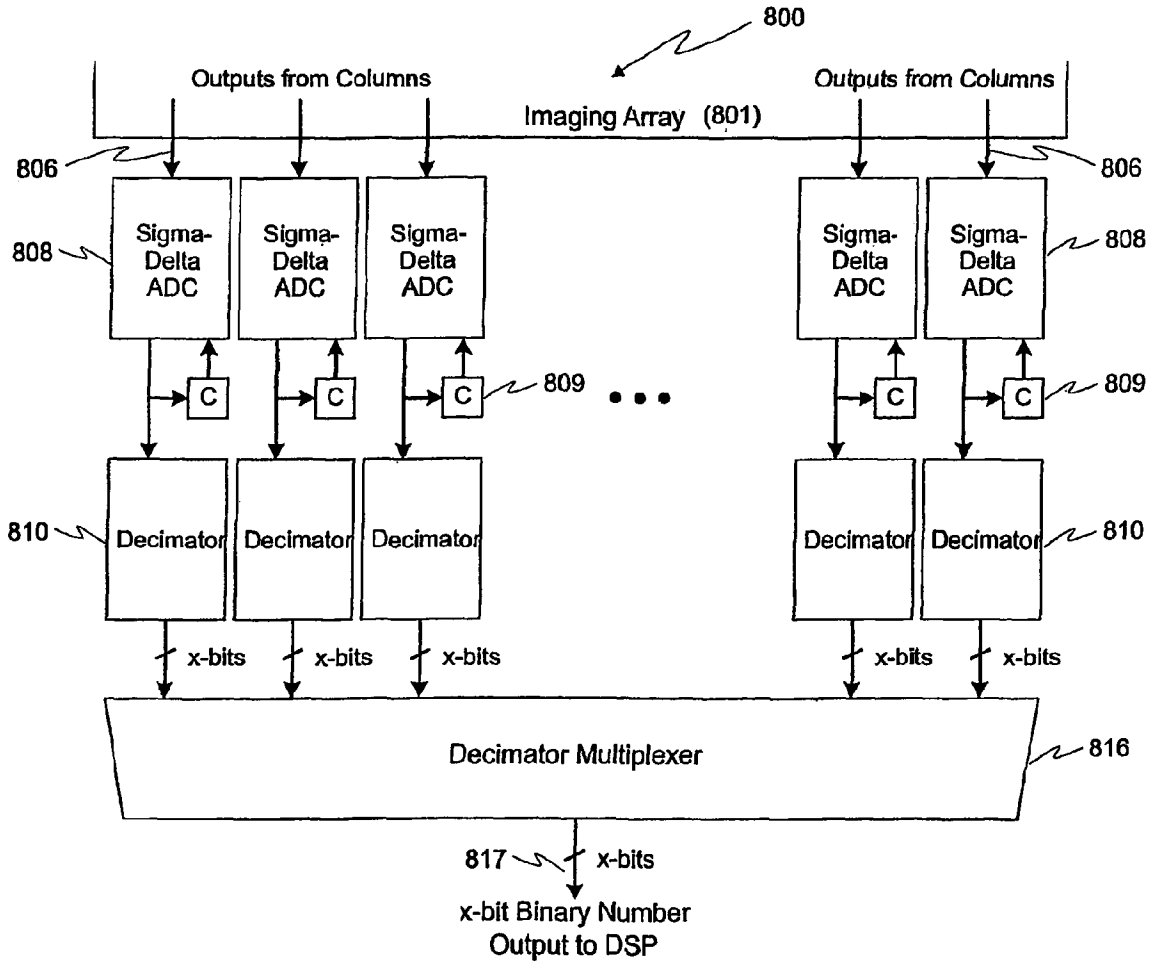
FIG. 8 illustrates imaging array with a decimator multiplexer for the outputs.
Figure 9:
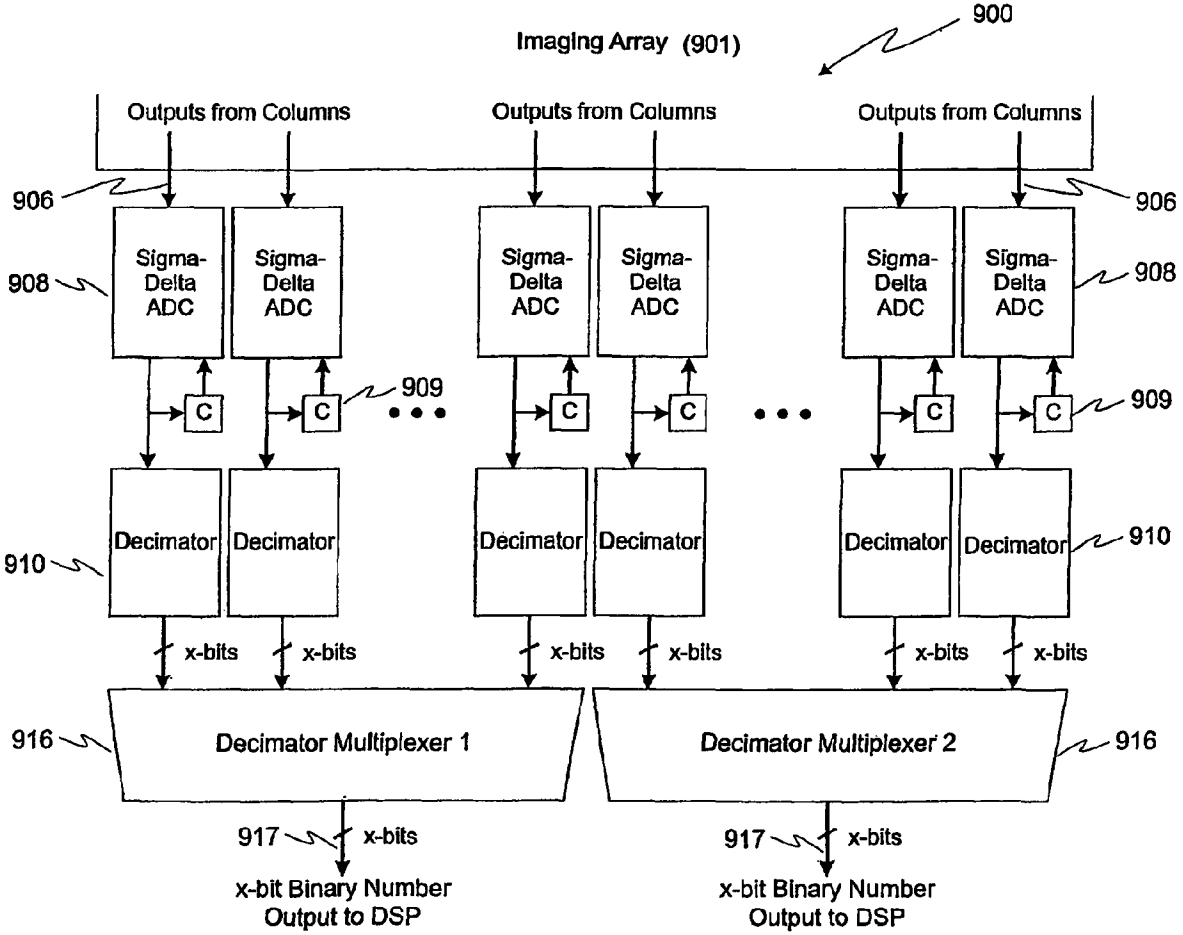
FIG. 9 illustrates imaging array with multiple decimator multiplexers for the outputs.

In FIGS. 8 and 9, imagers 800, 900 respectively are schematically illustrated wherein the imaging array 801, 901 column output lines 806, 906 are coupled to sigma-delta converters 808, 908. The outputs of the converters 808, 908 are coupled to counters 809, 909 and to decimators 810, 910. In these particular embodiments, the decimators 810, 910 outputs are coupled to one or more multiplexers 816, 916. As illustrated in FIG. 8, the multiplexer 816 is implemented along the column side of the imaging array 801 and consists of as many inputs as there are column lines 806, with one output 817 which is connected to the DSP. For example, suppose there are 1280 columns and the outputs from the decimators 810 are 10-bit binary numbers. The decimator output multiplexer 816 would then consist of 1280 10-bit inputs and one 10-bit output. The reason behind having this multiplexer 816 is that the DSP could be separated spatially from the imaging array 801 and the outputs 806 from the columns need to be bussed across the chip. By having the multiplexer 816 adjacent to the column directly connected to the outputs of the decimators 810 the apparatus would only need to bus one output 817, instead of 1280 outputs 806. A clock is used to sequentially scroll through all of the columns to transfer one decimator output to the DSP at a time. Other than reducing the number of electric lines needed to connect the array to the DSP, this embodiment is also beneficial in the sense that it is a fast and efficient way to read out the data.

Similarly, as shown in FIG. 9, multiple decimator output multiplexers 916 could be coupled to groups of decimators 910 with one output connection 917 from each of them bussed to the DSP. Each multiplexer 916 is of a smaller size than in the previous embodiment and is connected to a smaller section of the column lines 906. For example, using the array of 1280 columns mentioned previously, 64 decimator output multiplexers could be implemented, each with 20 10-bit inputs and one 10-bit output. The reasons behind using more than one multiplexer is to be able to have all the decimator 910 outputs transferred efficiently and easily to the DSP. The previous embodiment needs a very fast and accurate clock to be implemented, whereas this embodiment is not as demanding and precise, yet still reduces the number of electric lines 906 needed between the imaging array 901 and the DSP by a large factor.

While the invention has been described according to what is presently considered to be the most practical and preferred embodiments, it must be understood that the invention is not limited to the disclosed embodiments. Those ordinarily skilled in the art will understand that various modifications and equivalent structures and functions may be made without departing from the spirit and scope of the invention as defined in the claims. Therefore, the invention as defined in the claims must be accorded the broadest possible interpretation so as to encompass all such modifications and equivalent structures and functions.

What is claimed is:

1. In an imager having an array of pixels in rows and columns with column lines for pixel output signals, a method of processing the pixel output signals comprising:

converting the pixel output signals on each column line to digital signals using a sigma-delta type analog-to-digital converter, the sigma-delta type converter outputting mainly logical ones for a high input signal level and outputting mainly zeros for a low input signal level;

feeding the digital signals to a digital signal processor; *and* monitoring the sigma-delta type converter to stop sampling of a pixel when pixel saturation is detected, wherein the monitoring step comprises, for each column:

at a first counter, counting consecutive zeros in the digital signals to a predetermined number, and detecting the pixel saturation in response to counting to the predetermined number at the first counter.

2. A method of processing the pixel output signals as claimed in claim 1 further comprising:

sending the sigma-delta type converter output to the digital signal processor when the pixel saturation is detected.

3. A method of processing the pixel output signals as claimed in claim 1 further comprising:

reading the next pixel in a column when the previous pixel is saturated.

4. A method of processing the pixel output signals as claimed in claim 1 further comprising:

reading the next row of pixels when the pixels in the previous row are all saturated.

5. A method of processing the pixel output signals as claimed in claim 1 further comprising, for each column:

condensing sets of a predetermined number of sigma-delta type converter output samples in a decimator to binary numbers of predetermined bit length.

6. A method of processing the pixel output signals as claimed in claim 5 further comprising, for each column:

determining the number of sigma-delta type converter output *samples* and outputting the determined number when the value of the first counter reaches the predetermined number; and feeding the determined number from the first counter to the decimator.

7. A method of processing the pixel output signals as claimed in claim 5 further comprising:

determining the number of sigma-delta type converter output samples and outputting the determined number when the value of the first counter reaches the predetermined number; and feeding the determined number from the first counter to the digital signal processor.

8. A method of processing the pixel output signals as claimed in claim 5 further comprising:

multiplexing the outputs of the decimators to provide one or more inputs to the digital signal processor.

9. In an imager having an array of pixels in rows and columns with column lines for pixel output signals, apparatus for processing the pixel output signals comprising:

a sigma-delta type analog-to-digital converter for converting the pixel output signals on each column line to digital signals, the sigma-delta type converter outputting mainly logical ones for a high input signal level and outputting mainly zeros for a low input signal level;

means for feeding the digital signals to a digital signal processor;

means for detecting pixel saturation; and means for stopping sampling of a pixel when the pixel saturation is detected, wherein the detecting means comprises:

a first counter provided for each column for counting consecutive zeros in the digital signals to a predetermined number to determine when the pixel saturation has occurred.

10. Apparatus for processing the pixel output signals as claimed in claim 9 further comprising:

means for sending the sigma-delta type converter output to the digital signal processor when the pixel saturation is detected.

11. Apparatus for processing the pixel output signals as claimed in claim 9 further comprising:

a decimator provided for each column for condensing sets of a predetermined number of sigma-delta type converter output samples to binary numbers of predetermined bit length.

12. Apparatus for processing the pixel output signals as claimed in claim 11 further comprising:

means provided for each column for determining the number of sigma-delta type converter output samples and outputting the determined number when the value of the first counter reaches the predetermined number; and means for feeding the determined number from the number determining means to the corresponding decimator.

13. Apparatus for processing the pixel output signals as claimed in claim 12 wherein the number determining means is a second counter, and wherein when the second counter outputs the determined number to the corresponding decimator, the corresponding decimator outputs the binary numbers and the second counter resets to zero.

14. Apparatus for processing the pixel output signals as claimed in claim 11 further comprising:

means provided for each column for determining the number of sigma-delta type converter output samples and outputting the determined number when the value of the first counter reaches the predetermined number; and means for feeding the determined number from the number determining means to the digital signal processor.

15. Apparatus for processing the pixel output signals as claimed in claim 14, wherein the number determining means is a second counter, and wherein when the second counter outputs the determined number to the digital signal processor, the second counter resets to zero.

16. Apparatus for processing the pixel output signals as claimed in claim 11 further comprising:

means for multiplexing the outputs of the decimators to provide one or more inputs to the digital signal processor.

17. Apparatus for processing the pixel output signals as claimed in claim 16 wherein the multiplexing means comprises a multiplexer for providing one input line to the digital signal processor.

18. Apparatus for processing the pixel output signals as claimed in claim 16 wherein the multiplexing means comprises a number of multiplexers for providing a number of input lines to the digital signal processor.

19. Apparatus for processing the pixel output signals as claimed in claim 9 further comprising:

means for reading the next pixel in a column when the previous pixel is saturated.

20. Apparatus for processing the pixel output signals as claimed in claim 9 further comprising:

means for reading the next row of pixels when the value of the first counter reaches the predetermined number.

*21. In an imager having an array of pixels in rows and columns with column lines for pixel output signals, a method comprising:*

*processing the pixel output signals on each column line using a sigma-delta type analog-to-digital converter, the sigma-delta type converter outputting digital signals comprising mainly logical ones for a high input signal level and comprising mainly zeros for a low input signal level; and*

*monitoring the sigma-delta type converter to stop sampling of a pixel in response to detecting pixel saturation;*

*wherein the monitoring step comprises, for each column:* at a first counter, counting consecutive zeros in the digital signals to a predetermined number; and detecting pixel saturation in response to counting to the predetermined number at the first counter.

22. The method of claim 21 further comprising reading a next pixel in a column in response to detecting that a previous pixel is saturated.

23. The method of claims 21 further comprising reading a next row of pixels in response to detecting pixels of a previous row are saturated.

24. The method of claim 21 further comprising, for each column, condensing sets of a predetermined number of sigma-delta type converter output samples in a decimator to binary numbers of predetermined bit length;

determining the number of sigma-delta type converter output samples and outputting the determined number when the value of the first counter reaches the predetermined number; and feeding the determined number from the first counter to the decimator.

25. In an imager having an array of pixels in rows and columns with column lines for pixel output signals, an apparatus comprising:

a sigma-delta type analog-to-digital converter configured to convert the pixel output signals on each column line to digital signals, wherein the sigma-delta type converter outputs mainly logical ones for a high input signal level and outputs mainly zeros for a low input signal level;

means for detecting pixel saturation; and means for stopping sampling of a pixel in response to detecting pixel saturation;

wherein the detecting means comprises a first counter provided for each column for counting consecutive zeros in the digital signals to a predetermined number to detect pixel saturation.

26. The apparatus of claim 25 further comprising a decimator provided for each column, wherein the decimator is configured to condense sets of a predetermined number of sigma-delta type converter output samples to binary numbers of predetermined bit length.

27. The apparatus of claim 26 further comprising:

means provided for each column for determining the number of sigma-delta type converter output samples and outputting the determined number when the value of the first counter reaches the predetermined number; and means for feeding the determined number from the number determining means to the corresponding decimator.

28. The apparatus of claim 27 wherein the number determining means comprises a second counter, and wherein when the second counter outputs the determined number to the corresponding decimator, the corresponding decimator outputs the binary numbers and the second counter resets to zero.

29. An apparatus comprising:

a sigma-delta type analog-to-digital converter configured to convert pixel output signals to digital signals comprising mainly logical ones for a high input signal level and mainly zeros for a low input signal level, and to stop sampling a pixel in response to detected pixel saturation; and a saturation counter configured to count consecutive zeros in the digital signals and to detect pixel saturation in response to obtaining a predetermined count associated with pixel saturation.

30. The apparatus of claim 29 further comprising:

a digital signal processor configured to determine pixel values based upon output signals; and output circuitry configured to receive the digital signals and to provide output signals to the digital signal processor.

31. The apparatus of claim 29 further comprising:

a digital signal processor configured to determine pixel values based upon binary numbers of a predetermined bit length; and output circuitry configured to receive the digital signals and to provide output signals comprising binary numbers of the predetermined bit length to the digital signal processor, the output circuitry comprising one or more decimators configured to condense sets of a predetermined number of sigma-delta type converter output samples of the digital signals to binary numbers of the predetermined bit length.

32. The apparatus of claim 31 wherein the output circuitry further comprises one or more decimator counters configured to feed the one or more decimators with the predetermined number of sigma-delta type converter output samples in response to the saturation counter reaching the predetermined count.

33. The apparatus of claim 32, wherein the output circuitry further comprises one or more multiplexers configured to receive the binary numbers of the predetermined length from the one or more decimators and to provide to the digital signal processor with the binary numbers of the predetermined length.

34. The apparatus of claim 29 further comprising a digital signal processor configured to determine pixel values based upon a predetermined number of sigma-delta type output samples of the digital signals; and output circuitry configured to provide the predetermined number of sigma-delta type output samples to the digital signal processor, the output circuitry comprising one or more decimator counters configured to feed the digital signal processor with the predetermined number of sigma-delta type output samples in response to the saturation counter reaching the predetermined count.

35. The apparatus of claim 34, wherein the output circuitry further comprises one or more multiplexers configured to receive the predetermined number of sigma-delta type output samples and to provide the predetermined number of sigma-delta type output samples to the digital signal processor.

36. The apparatus of claim 29, wherein in response to detecting pixel saturation, the saturation counter provides a feedback that results in the sigma-delta type analog-to-digital converter reading a next pixel in a column of pixels.

37. The apparatus of claim 29, further comprising a plurality of sigma-delta type analog-to-digital converters, each sigma-delta type analog-to-digital converter configured to convert pixel output signals for a column of pixels to digital signals comprising mainly logical ones for a high input signal level and mainly zeros for a low input signal level, and to stop sampling a pixel in response to detected pixel saturation;

a plurality of saturation counters, each saturation counter configured to count consecutive zeros in the digital signals and to detect pixel saturation in response to reaching the predetermined count associated with pixel saturation;

row enable circuitry to select a next row of pixels for reading by the plurality of sigma-delta type analog-to-digital converters in response to a result that indicates that each of the plurality of saturation counters detected pixel saturation; and a comparator to receive outputs from each of the plurality of saturation counters and to provide the row enable

*circuitry with the result in response to determining based upon the received outputs that each of the plurality of saturation counters detected pixel saturation.*

*38. An apparatus comprising:*

*an array of pixels in rows and columns;*

*a plurality of column lines to carry pixel output signals;*

*one or more sigma-delta type analog-to-digital converters, each of the one more sigma-delta analog-to-digital converters configured to convert pixel output signals to digital signals comprising mainly logical ones for a high input signal level and mainly zeros for a low input signal level, and to stop converting pixel output signals of a pixel in response to detected saturation of the pixel;*

*column output circuitry configured to receive the digital signals and to feed output signals to a digital signal processor; and*

*a plurality of saturation counters configured to detect pixel saturation, each saturation counter configured to count consecutive zeros in the digital signals of a corresponding column line, and to detect saturation in response to reaching a predetermined count.*

*39. The apparatus of claim 38 further comprising a digital signal processor configured to determine pixel values based upon the output signals of the column output circuitry.*

*40. The apparatus of claim 39 further comprising a digital signal processor configured to determine pixel values based upon binary numbers of a predetermined bit length, wherein the column output circuitry is configured to provide output signals comprising binary numbers of the predetermined bit length to the digital signal processor, the column output circuitry comprising a plurality of decimators configured to condense sets of a predetermined number of sigma-delta type converter output samples of the digital signals to binary numbers of the predetermined bit length.*

*41. The apparatus of claim 40 wherein the column output circuitry further comprises a plurality decimation counters configured to feed a corresponding decimator of the plurality of decimators with the predetermined number of sigma-delta type converter output samples in response to corresponding saturation counters reaching the predetermined number.*

*42. The apparatus of claim 41, wherein the column output circuitry further comprises a multiplexer configured to receive outputs from the plurality of decimators and to provide the outputs of the plurality of decimators to the digital signal processor.*

*43. The apparatus of claim 39, wherein in response to detecting pixel saturation, a saturation counter of the plurality of saturation counters provides a feedback that results in a corresponding sigma-delta type analog-to-digital converter reading a next pixel in a column of pixels.*

*44. The apparatus of claim 39, further comprising*

*row enable circuitry configured to select a next row of pixels for reading by the plurality of sigma-delta type analog-to-digital converters in response to a result that indicates that each of the plurality of saturation counters detected pixel saturation; and*

*a comparator configured to receive outputs from each of the plurality of saturation counters and to provide the row enable circuitry with the result in response to determining based upon the received outputs that each of the plurality of saturation counters detected pixel saturation.*

* * * * *

UNITED STATES PATENT AND TRADEMARK OFFICE

CERTIFICATE OF CORRECTION

PATENT NO. : RE42,739 E
APPLICATION NO. : 12/717188
DATED : September 27, 2011
INVENTOR(S) : Fortier It is certified that error appears in the above-identified patent and that said Letters Patent is hereby corrected as shown below:

Column 8, line 31, in Claim 15, delete "*claim 14*, *wherein*" and insert -- *claim 14 wherein* --.

Column 9, lines 11-12, in Claim 24, delete "*for each column*," and insert -- *for each column:* --.

Column 10, line 28, in Claim 34, delete "*further comprising*" and insert -- *further comprising:* --.

Column 10, line 48, in Claim 37, delete "*further comprising*" and insert -- *further comprising:* --.

Column 11, line 8, in Claim 38, delete "*the one more*" and insert -- *the one or more* --.

Column 12, line 9, in Claim 42, delete "*claim 41*, *wherein*" and insert -- *claim 41 wherein* --.

Column 12, line 14, in Claim 43, delete "*claim 39*, *wherein*" and insert -- *claim 39 wherein* --.

Column 12, line 19, in Claim 44, delete "*claim 39*, *further comprising*" and insert -- *claim 39 further comprising:* --.

Signed and Sealed this
Nineteenth Day of June, 2012

David J. Kappos

David J. Kappos
*Director of the United States Patent and Trademark Office*